United States Patent [19]
Schnatzmeyer et al.

[11] Patent Number: 6,150,601
[45] Date of Patent: Nov. 21, 2000

[54] METHOD AND APPARATUS FOR GENERATING ELECTRIC POWER DOWNHOLE

[75] Inventors: Mark A. Schnatzmeyer, Lewisville; Clark E. Robison, Plano, both of Tex.

[73] Assignee: Halliburton Energy Services, Inc., Dallas, Tex.

[21] Appl. No.: 09/067,694

[22] Filed: Apr. 28, 1998

[51] Int. Cl.[7] .................................................. H01L 35/00
[52] U.S. Cl. .......................... 136/201; 136/208; 136/211; 136/212; 166/65.1
[58] Field of Search .................................. 136/200, 205, 136/208, 211, 212, 225, 226, 230, 201; 166/65.1

[56] References Cited

U.S. PATENT DOCUMENTS

| | | |
|---|---|---|
| 2,349,306 | 5/1944 | Ray . |
| 2,944,603 | 7/1960 | Baker et al. . |
| 3,278,335 | 10/1966 | Hitzman . |
| 3,280,923 | 10/1966 | Muench ................................. 136/205 |
| 3,709,739 | 1/1973 | Webb . |
| 4,047,093 | 9/1977 | Levoy ..................................... 310/306 |
| 4,132,269 | 1/1979 | Chasteen . |
| 4,275,259 | 6/1981 | Yamamoto et al. . |
| 4,459,428 | 7/1984 | Chou . |
| 5,039,351 | 8/1991 | Cooper et al. . |
| 5,228,923 | 7/1993 | Hed . |
| 5,547,028 | 8/1996 | Owens et al. ........................... 166/302 |

FOREIGN PATENT DOCUMENTS

| | | |
|---|---|---|
| 2 145 876 | 4/1985 | United Kingdom . |
| WO 97/38451 | 10/1997 | WIPO . |

OTHER PUBLICATIONS

Thermacore, Inc., "Heat Pipe Technology—The Heat Pipe, How It Works" at <http://www.thermacore.inter.net/techno.htm> (Publication date unknown).

*Primary Examiner*—Kathryn Gorgos
*Assistant Examiner*—Thomas H Parsons
*Attorney, Agent, or Firm*—Paul I. Herman; Kevin L. Smith

[57] ABSTRACT

Electric power is generated downhole in a well using a thermoelectric device. A temperature gradient or differential $\Delta T$ present in the well is applied to the thermoelectric device to produce a voltage potential across the output terminals of the device. The thermoelectric device includes a first thermocouple coupled to a heat source and a second thermocouple coupled to a heat sink source. The electric power generated by the thermoelectric device is used to recharge battery packs located downhole or to power electrical devices or systems.

27 Claims, 11 Drawing Sheets

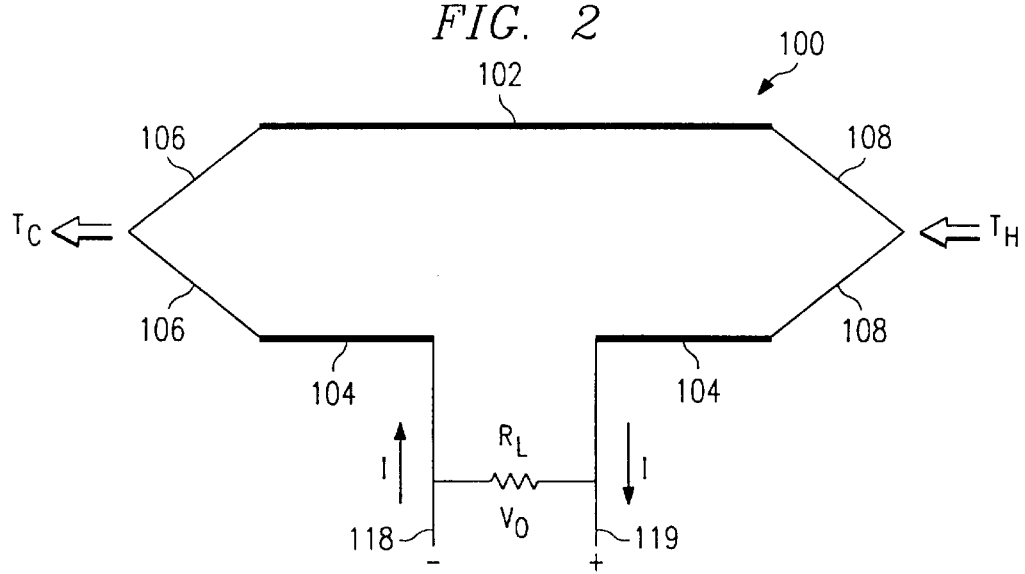
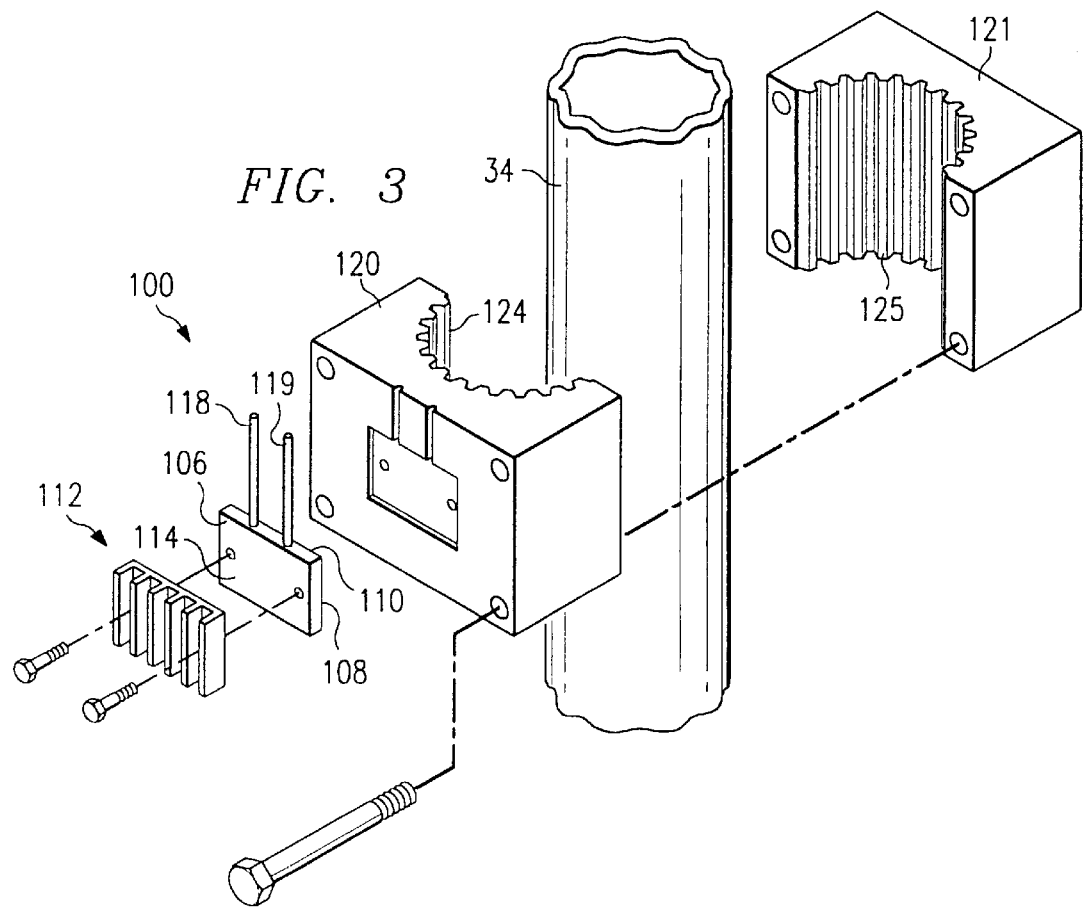

METHOD AND APPARATUS FOR GENERATING ELECTRIC POWER DOWNHOLE

BACKGROUND OF THE INVENTION

1. Field of the Invention

This invention relates to a method and apparatus for generating electric power in a downhole environment, and in particular to a method and apparatus for generating electric power using a thermoelectric device by converting a downhole temperature gradient into electric power.

2. Description of the Related

Battery packs are used downhole in wells for providing power to downhole electrical systems, system electronics, and other downhole devices or tools. The electrical loads connected to the battery packs require relatively high discharge rates that result in short battery pack life spans. Moreover, the hostility (heat, pressure, and the like) of the downhole environment also contributes to a shorter life span.

Generally, the downhole electrical systems powered by these battery packs are used during early stages of the well completion and are primarily to test aspects of the well. The life span of the battery packs are critical. In many installations in hostile downhole environments, a battery pack typically has a fourteen-day life span. If a well completion job or test job is delayed or the battery pack life span is too short for the job, the well tool must be retrieved from downhole, the battery pack is replaced and the well tool is replaced downhole to continue the completion or test job. This process is expensive (i.e. well intervention, additional labor and battery packs) and time-consuming.

Downhole electrical systems are becoming increasingly complex and requiring larger electrical loads. These larger and more powerful systems decrease even further the typical life span of a battery pack due to the increased energy consumption. The complexity and usefulness of downhole electrical systems is rapidly expanding to include downhole sensors, surface reconfigurable flow controls, data telemetry systems, and other electrical monitoring and sensing systems.

Downhole electronic sensors—such as transducers—are used to gather data useful in determining the operation of controls needed to manage the production processes in a well. Electronic sensors detect conventional and specialized subterranean formations and downhole parameters such as pressure data, temperature data, and near-bore flow effect measurements. This data is used to determine how a particular subterranean formation should be managed to maximize well production. Such sensors may have significant electrical power requirements depending on the nature and volume of the data, and sometimes require electrical energy at greater levels for extended periods of time.

Surface reconfigurable flow controls remain downhole after well completion for managing the production flow of subterranean formations, preferably for the production life of the well, which can potentially span decades. Conventional battery packs are unable to provide such long-term energy requirements.

Telemetry systems provide communications between downhole sensors or mechanisms and the well-site surface. At present, wireless telemetry systems have been used for only short term applications such as for initial production well tests. Battery life determines the length these systems may remain operable, and conventional battery packs have been unable to provide the necessary electric power for wireless signal transmission from a downhole environment for extended periods because wireless transmissions from downhole to the surface require a large amount of energy—on average 500 to 800 watts—because of the need to transmit and to propagate the signals through the earth. In comparison, wireless receptions downhole of a signal transmitted from the surface through the earth require only about 100 milliwatts of electrical energy. This is still a significant level of power when it is needed on a continuous basis.

The only alternative to battery packs is to use conventional power cables. However, cables are highly susceptible to failure in hostile downhole environments. For example, cables are generally carried on the exterior of a tubing string to the downhole sensor-deployment site. In most cases, the deployment sites are miles below the earth's surface. During the journey, severe friction and shear forces are present that can break or disable the cable. Also, if the downhole electrical system (such as a formation test or control apparatus) must travel a long distance, then the cable may break under its own weight. Furthermore, the internal electrical resistance (per unit-length) attenuates the power signal before it reaches the downhole electrical systems, thus requiring increased power at the surface. Additionally, the ambient fluids, typically at elevated pressure and temperature, may invade the shielding causing premature failure.

Thus, there exists a need for a self-sustaining, downhole electric power source that can provide power for downhole test, well completion, and flow control devices. Also, a need exists for a downhole electric energy source to recharge downhole battery packs and thus extend the life span of the battery packs.

SUMMARY OF THE INVENTION

Accordingly, provided is a method and apparatus for providing electric energy in a downhole environment by converting a downhole temperature gradient into electric energy.

Electric power is provided in a well by applying a temperature gradient of the well across a thermoelectric device having a first and a second thermocouple, and an electric power output terminal.

Another aspect of the invention is an apparatus for providing electric power while in a well. The apparatus has a thermoelectric device with a first thermocouple, a second thermocouple, and an electric power terminal. A temperature gradient device engages the first thermocouple in thermal communication with a heat source, and engages the second thermocouple with a heat sink source such that an electric output is realized at the electric power terminal.

BRIEF DESCRIPTION OF THE DRAWINGS

FIG. 2 is an electrical schematic representation of a thermoelectric device;

FIG. 3 is an exploded perspective view of a thermoelectric device thermally-coupled to a tubing string;

DETAILED DESCRIPTION OF A PREFERRED EMBODIMENT

The principles of the present invention and their advantages are best understood by referring to the illustrated embodiment depicted in the FIGURES, in which like reference numbers describe like parts.

Figure 1:
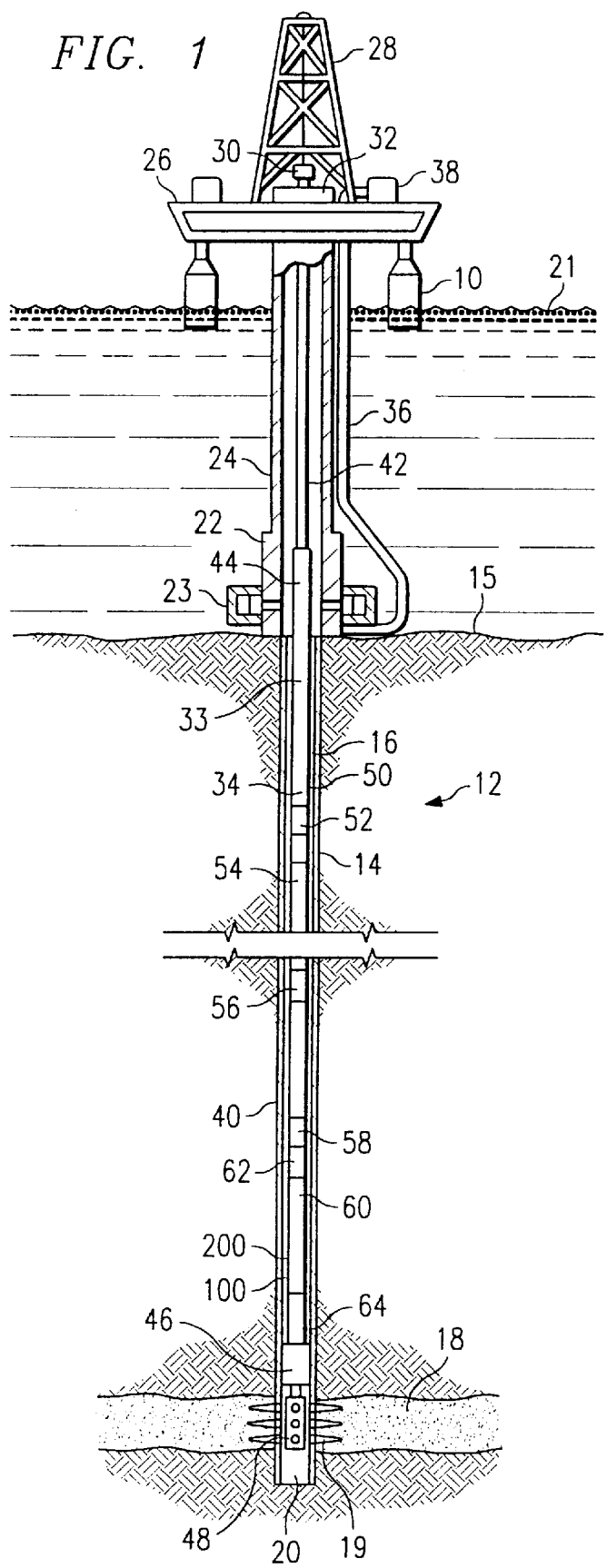
FIG. 1 is a schematic elevational view of a test tubing string disposed in a subsea oil or gas well.

Referring to FIG. 1, shown is a schematic elevational view of a tubing string disposed in a subsea oil or gas well system 8.

The subsea well system 8 includes a floating work station 10 stationed over an ocean floor surface 15 with a submerged well 12. The well 12 includes a well bore 14 that is lined with a casing string 16 having an inner surface 17. The well bore 14 extends from the surface 15 of the submerged well 12 to a lower interior zone 20 adjacent a subterranean formation 18. As will be appreciated, the formation 18 contains the fluid, such as oil or gas, to be produced by the well system 8.

When the casing string 16 is present, the casing string 16 includes one or more perforations 19 at the lower interior zone 20. The perforations 19 provide flow communication between the formation 18 and the lower interior zone 20 of the well bore 14.

Located at the surface 15 of the submerged well 12 is a wellhead installation 22 having a blowout preventer mechanism 23. A marine conductor 24 extends from the wellhead installation 22 to the floating work station 10 above the ocean surface 21. The wellhead installation 22 and the marine conductor 24 provide a conduit 25 for fluids or gas from the formation 18 to the floating work station 10.

The floating work station 10 includes a work deck 26. The work deck 26 supports a derrick 28. The derrick 28 supports a hoisting means 30 through a wellhead closure 32. A wellhead closure 32 allows for lowering a test or tubing string 34 into the marine conductor 24 and the well bore 14. The tubing string 34 is raised and lowered in the well bore 14 by the hoisting means 30. The tubing string 34 is also generally referred to as a test string or a tool string, and generally comprises interconnected pipe sections and having an outer surface 33. The tubing string 34 includes an upper conduit string portion 42 extending from the work deck 26 to the wellhead installation 22. A subsea test tree 44 extends to the blow-out preventer 23.

A hydraulic supply conductor 36 extends from a hydraulic pump 38 on the work deck 26 of the floating work station 10. The supply conductor 36 extends to the wellhead installation 22 at a point below the blowout preventer 23 to allow the pressurizing of a well annulus 40. The well annulus 40 is defined between the outer surface 33 of the tubing string 34 and the well bore 14, or the casing 16 (if present).

When set using well known techniques a packer 46 isolates the formation 18 from the fluids or other materials in the well annulus 40. An inner bore 35 is defined within the tubing string 34 and is isolated from the well annulus 40 above the packer 46 unless communication openings are otherwise provided. The well annulus 40 above the packer 46 is isolated from the lower interior zone 20. A perforated tail piece 48 is provided at the lower end of the tubing string 34 to allow fluid communication between the formation 18 and the inner bore 35 of the test string 34.

A circulating valve 56 is placed near the lower end of the test string 34. Below the circulating valve 56 there may be located a combination sampler valve section and reverse circulating valve 58. A flow control valve 82 that selectively allows fluids to flow from the formation 18 is provided. The flow control valve 82 may be remotely actuated. Above the flow control valve 82 may be located a drill pipe tester valve 62l It will be understood to those skilled in the art that the well system 8 is shown in use with a subsea gas or oil well and that the well system 8 (without certain elements) may also be used on land.

When testing the production capabilities of the well 12 (generated from the formation 18) after the well bore 14 has been drilled, a tubing string 34 that includes interconnected pipe sections and downhole tools, also commonly referred to as a test string, is lowered into the well bore 14 to a predetermined depth to test or complete the well 12. Formation fluid or gas is allowed to flow into the inner bore 35 of the tubing string 34.

A lower pressure is sometimes maintained in the interior of the tubing string 34 compared to the pressure in the well annulus 40 when the tubing string 34 is lowered into the well bore 14. The lower pressure is usually maintained by providing a formation tester valve (such as flow control valve 82) in a closed position near the lower interior zone 20 of the tubing string 34.

When a testing or completion depth is reached, the packer 46 is set, sealing the well annulus 40 from the formation 18. The formation 18 is isolated from the hydrostatic pressure of a drilling fluid (or other material) in the well annulus 40 above the packer 46. When the valve 82 is opened, the fluid or gas in the formation 18, free from the restraining pressure of the drilling fluid in the annulus 40, flows through the inner bore 35 of the tubing string 34 (and eventually up to the well surface 15).

At other times, the conditions of the well are such that it is desirable to fill the tubing string 34 above the drill pipe tester valve 62 with liquid (or other material) as the tubing string 34 is lowered into the well bore 14. Filling the tubing, string 34 in this fashion serves the purpose of equalizing the hydrostatic pressure head across the walls of the test string to prevent inward collapse of the pipe and/or for the purpose of permitting pressure testing of the tubing string 34 as it is lowered into the well bore 14.

A typical well testing program includes intervals of flow from the formation 18 and intervals when the formation 18 is isolated. Pressure recordings may be taken throughout the well bore 14 for later analysis to determine the production capability of the formation 18. Also, if desired, a formation fluid sample may be collected in a suitable sample chamber.

Upon completion of the well testing program, the circulating valve 56 in the tubing string 34 is opened, the formation fluid in the tubing, string 34 is circulated out, the packer 46 is released, and the tubing string 34 is withdrawn. Alternatively, when the tubing string 34 is configured for well completion, then the tubing string 34 remains in the well bore 14 with the packer 46 set to perform production functions.

Note that the present invention may also be used with on-shore wells for well completion and production testing (same as a drill stem test only after the well has been completed for production).

Now referring to FIG. 2, shown is a schematic representation of a thermoelectric ("TE") device 100 used in the present invention. The TE device 100 employs the Seebeck effect and converts temperature gradients into electric power.

The TE device 100 has a first conductor material 102 and a second conductor material 104. The term conductor as used herein means metals, semi-metals, or semiconductors (or any other electrically conductive materials). Preferably, semiconductor materials are used in the TE device 100. Examples of semiconductor materials are p-type and n-type doped-silicon. The first conductor material 102 and the second conductor material 104 have dissimilar conductivity characteristics.

A first thermocouple 106 (or thermal junction) is electrically coupled to the first conductor material 102 and the second conductor material 104. A second thermocouple 108 (or thermal junction) is electrically coupled on an end opposite to the first thermocouple 106 to the first conductor material 102 and the second material 104.

Thermoelectric devices that may be used in the present invention are commercially available from International Thermoelectric, Inc. of Chelmsford, Mass., such as part numbers 6302/065/018, 6301/127/030, or 6300/127/085. Other TE devices are also commercially available from Melcor Corporation of Trenton, N.J., and Thermolyte Corporation of Waltham, Mass.

In the present invention, the thermoelectric device identified as part number 6301/127/030 from International Thermoelectric, Inc. is preferred due to its desirable electric power output characteristics, as discussed below in further detail. Generally, the TE devices from International Thermoelectric, Inc. have an area of about four square-inches (twenty-five square-centimeters) and a thickness of about one-eighths inch (about 0.32 centimeters). Other devices from other suppliers may have other dimensions.

To generate an electric current I, a heat sink source $T_C$ is coupled to the first thermal junction or thermocouple 106 and a heat source $T_H$, is coupled to the second thermal junction or thermocouple 108. When the heat sink source $T_C$ temperature is less than the temperature of the heat source $T_H$, a temperature differential or gradient, $\Delta T = T_H - T_C$, is produced across the thermoelectric device 100. Application of the temperature gradient to the TE device 100 having an electrical load $R_L$ (in ohms) generates an electric potential or voltage $V_O$ and a current I (in amperes) across TE device output terminals 118 and 119. The output terminals 118 and 119 are conductors that are coupled to the structure of the TE device 100 through the second conductor material 104 such that the electrical power generated by applying the temperature gradient may be accessed.

The amount of electric power W (watts) generated is $I^2 R_L$, or alternately VI. The voltage $V_O$ is expressed as:

$$V_O = \alpha_{xy}(\Delta T)$$

where:

$V_O$ is the output voltage in volts;

$\alpha_{xy}$ is the differential Seebeck coefficient between the first conductor material 102 and the second conductor material 104 in volts-per-degree-Kelvin; and $\Delta T$ is the temperature gradient $T_H - T_C$ in degrees Kelvin.

Now referring to FIG. 3 there is shown an exploded perspective view of the TE device 100, a heat sink coupler 112 and a heat source coupler 120a and mating coupler 120b of the present invention. The TE device 100 includes the first thermocouple 106 having an outer surface 114 for coupling to a heat sink source $T_C$ and the second thermocouple 108 having an outer surface 110 for coupling to a heat source $T_H$.

The term "coupling" as used herein means, in the thermal sense, that a minimal thermal resistance exists between the object being coupled and the heat source or the heat sink source of the temperature gradient. Thermal coupling of the thermocouple 106 or the thermocouple 108 with a heat source or a heat sink source may occur by any means known to those skilled in the art including immersing, abutting, placing adjacent, contacting or embedding the thermocouple surfaces with the heat source $T_H$ or the heat sink source $T_C$ (i.e., thermal coupling through gas, liquid or solid).

Preferably, the thermocouple surfaces 110 and 114 are adapted to conform to the thermal sources $T_H$ and $T_C$ to reduce the profile of the TE device 100 and increase the surface area of contact between the thermal sources and the thermocouples 106 and 108, and to provide a generally consistent thermal source across the thermocouple surface. Thermal couplers—for the heat source $T_H$ and/or the heat sink source $T_C$—may be attached to the thermocouple surfaces 110 and 114 to minimize thermal resistance with the heat source $T_C$ and the heat sink source $T_C$.

Thermal couplers may also be used to adapt the TE device 100 (e.g., the surfaces 110, 114) thereby providing thermal coupling between the device 100 and the heat source $T_H$ and the heat sink source $T_C$ that may include an irregular or non-planar surface.

In FIG. 3, a heat source adapter or coupler 120a and mating coupler 120b are illustrated. The heat source coupler 120a and 120b is constructed of thermally conductive material and provides thermal coupling between the heat source $T_H$ and the TE device 100. The heat source coupler 120 is adapted to substantially conform to the shape of the surface of the heat source $T_H$ to increase thermal coupling effects. In the embodiment shown the heat source $T_H$ is the tubing string or a tool string 34 (shown in FIG. 1).

The heat source coupler 120 has an upper surface 124 that substantially conforms to the shape of the heat source $T_H$. It will be appreciated that if the heat source $T_H$ is liquid or gas, it will be desirable to have a relatively large surface area for the heat source coupler 120, or the heat source coupler 120 may not be needed depending on the desired amount of thermal coupling.

The heat source coupler 120a also as a planar bottom surface depression 122 adapted to couple with the thermocouple surface 110 of the second thermocouple 108. A pair of channels 122a and 122b extend from the bottom surface 122 to an outer periphery of the coupler 120a. The channels 122a and 122b receive TE device output terminals 118 and 119.

The top surface 124 of the heat source coupler 120a is adapted to accept the outer surface 33 of the tubing string 34.

As shown, the top surface 124 has a series of teeth or grooves to increase the frictional force of the coupler 120a and mating coupler 120b against the outer surface 33. Other surface shapes can be implemented according to the interface surface. Further, depending on the subterranean formations encountered, the outer surfaces of the adapter can be accordingly relieved with bevels or arcuate surfaces to ease insertion into a well bore 14.

Any type of material that is substantially thermally conductive may be used for the heat source coupler 1120a and the mating coupler 120b such as copper aluminum, stainless steel, or stainless steel alloys. Preferably, a stainless steel alloy with nickel, molybdenum, or tungsten, is used. Note that the mating coupler 120b may be constructed of a non-thermal conducting material since it is not in direct thermal contact with the second thermocouple 108 of the TE device 100. However, a thermally-conductive mating coupler 120b improves the thermal coupling of the TE device 100 with the heat source $T_H$ provided by the production flow temperature $T_F$.

Also illustrated in FIG. 3 is a heat sink source adaptor or coupler 112 for coupling to the thermocouple surface 114 of the first thermocouple 106. The heat sink coupler 112 is also made of a thermally-conductive material. The heat sink coupler 112 has a plurality of spaced-apart fins 116 to expose a larger surface area than the outer surface 114 to the heat sink source $T_C$. Similarly to the heat source coupler 120, the heat sink couple r may be constructed to adapt to the heat sink source $T_C$. The larger surface area of the heat sink coupler 112 improves energy conversion efficiency of the TE device 100 by providing increased thermal coupling with fluids in the well annulus 40.

The heat sink coupler 112 is secured to the TE device 100 (or to the surfaces 110 and 114, respectively) using securing devices such as bolts 127a received in prethreaded apertures 127b.

The TE device 100, the heat sink coupler 112, and the heat source coupler 120a and 120b, are secured to the tubing string 34 using bolts, screws, thermally-conductive adhesives, or the like, or any other attachment means or method. The TE device 100 is shown secured to the tubing string 34 with bolts 126 extending through receiving holes 128 defined in the heat source coupler 120a that are threadingly received in the mating heat source coupler 120b through pre-threaded apertures 130.

As will be appreciated, the heat source coupler 120a, mating coupler 120b and the heat sink coupler 112 may also be secured to the TE device 100 (or to the surfaces 110 and 114, respectively) by using separate or additional bolts, screws, thermally-conductive adhesives, or the like, or any other attachment means.

A thermally-conductive grease is preferably applied to the thermal interfaces (between the couplers 120, 112 and the surfaces 110, 114, and between the couplers 120, 112 and heat source $T_H$, and the heat sink source $T_C$, if desired). For example, thermally-conductive grease is applied between the heat sink coupler 112 and the first thermocouple 106 (surface 114), between the bottom surface 122 of the heat source coupler 120 and the second thermocouple 108 (surface 110), and between the concave top surface 124 of the heat source coupler 120 and the outer surface 33 of the tubing string 34.

This thermally-conductive grease enhances the thermal conductivity of the surfaces. Thermally-conductive grease is commercially available from American Oil & Supply, Dow Corning, or General Electric. A preferred thermally-conductive grease is available from American Oil & Supply under the product code designation 52032.

Figure 4:
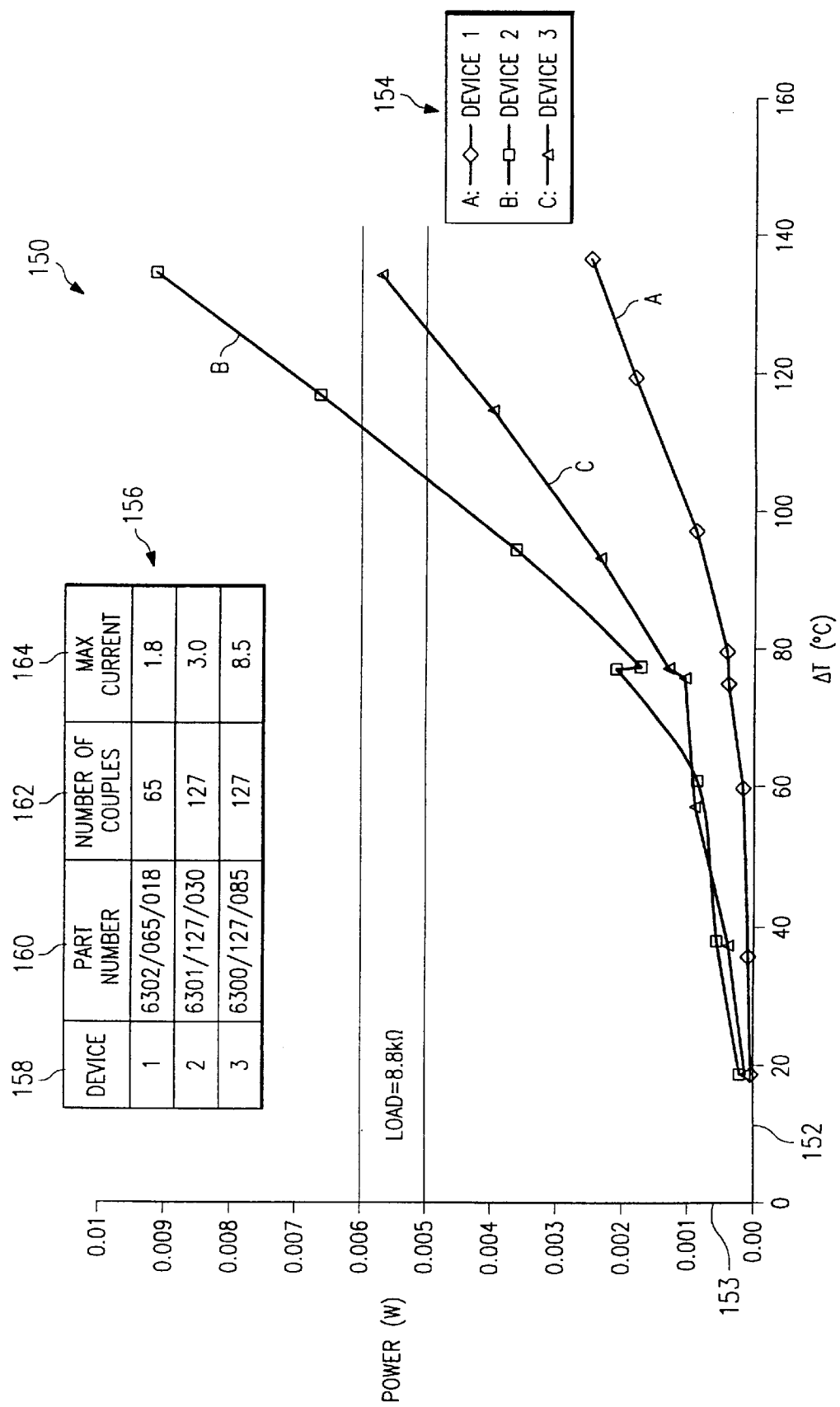
FIG. 4 is a power versus temperature-gradient line plot showing the power characteristics of the thermoelectric device.
Figure 5:
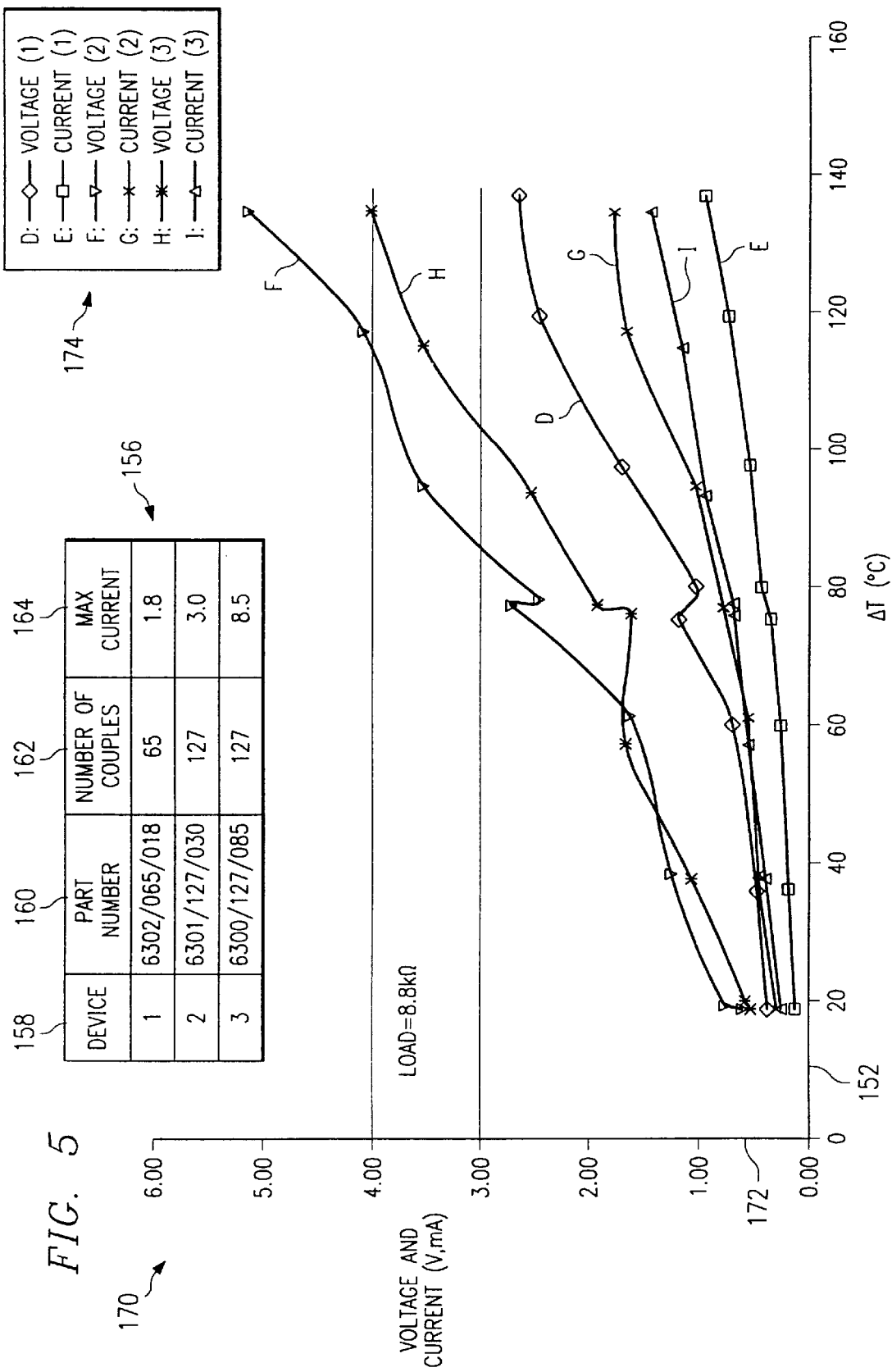
FIG. 5 is a voltage-and-current versus temperature-gradient line plot showing the output characteristics of the thermoelectric device.

Now referring to FIGS. 4 and 5, there are shown line plots representing the electric power characteristics of the TE device 100 with an electrical load $R_L$ (see FIG. 2) of about 8.8 Kilo-ohms across electric terminals 118 and 119. The characteristic plots are for three TE devices, part numbers 6302/065/018, 6301/127/030, and 6300/127/085 obtained from International Thermoelectric, Inc. of Chelmsford, Mass. These TE devices are identified as device 1, 2 and 3, respectively.

FIG. 4 presents a power versus temperature-gradient plot 150 showing the power characteristics for each of the TE devices 100 (devices 1, 2 and 3) with respect to different magnitudes of temperature gradients or differentials ΔT. The x-axis 152 is a scale of temperature differentials ΔT, in degrees-Celsius. The y-axis 153 is a scale of the power output, in watts, across the electric terminals 118 and 119 of the respective TE device part numbers, set out above.

The plot 150 has a plot legend 154 and a device-under-test block 156, to correlate the plot lines A, B, and C to the thermoelectric devices tested (devices 1, 2 and 3, respectively). The device-under-test block 156 has a device field 158, a part number field 160, a number of couples field 162, which is a manufacturing characteristic of the TE device with respect to the number of p-n junctions in the TE module 100, and a maximum current field 164 (in milli-amp units).

The plot legend 154 and the device-under-test block 156 illustrate that the plot line A corresponds to the thermoelectric device 1 having the part number 6302/065/018; the plot line B corresponds to the thermoelectric device 2 having part number 6301/127/030; and the plot line C corresponds to the thermoelectric device 3 having the part number 6300/127/085.

As shown in FIG. 4, the plot line B for the thermoelectric device part number 6301/127/030 has the most favorable wattage output characteristics across its electrical terminals 118 and 119 in comparison to plot lines A and C. Over a temperature gradient range from about 60-degrees Celsius to about 140-degrees Celsius the plot line B shows that this part number has a range from about 0.001 watts to about 0.009 watts, respectively (having a load $R_L$ of 8.8 Kilo-ohms).

FIG. 5 presents a voltage-and-current versus temperature-gradient plot 170 showing the output (voltage and current) characteristics for each of the TE devices 100 (devices 1, 2 and 3) when exposed to different magnitudes of temperature gradients (or differentials) ΔT. The x-axis 152 is a scale of temperature differentials ΔT, in degrees-Celsius. The y-axis 172 is a scale of the power output, in volts and milli-amps, across the electric terminals 118 and 119 of the respective TE devices listed in the device-under-test block 156.

The plot 170 has a device-under-test block 156 and a plot legend 174 to correlate the plot lines D, E, F, G, H, and I to the thermoelectric devices tested (devices 1, 2 and 3).

In FIG. 5, the plot legend 174 and the device-under-test block 156 illustrate that the plot line D corresponds to the voltage characteristics for the thermoelectric device 1 having the part number 6302/065/018; the plot line E corresponds to the current characteristics for thermoelectric device 1 having the part number 6302/065/018; the plot line F corresponds to the voltage characteristics for the thermoelectric device 2 having the part number 6301/127/030; the plot line G corresponds to the current characteristics for the thermoelectric device 2 having, the part number 6301/127/030; the plot line H corresponds to the voltage characteristics for the thermoelectric device 3 having the part number 6300/127/085; and the plot line I corresponds to the current characteristics for the thermoelectric device 3 having the part number 6300/127/085.

The voltage plot line F and the current plot line G illustrate that the thermoelectric device part number 6301/127/030 has the most favorable output characteristics across its electrical terminals 118 and 119 with respect to the other two devices. Over a temperature gradient range of about 20-degrees Celsius to about 140-degrees Celsius, the voltage-plot line F shows a voltage range from about 0.8 volts to about 5.2 volts. The current-plot line G, shows a current range from about 0.5 milliamps to about 1.8 milliamps.

The power versus temperature-gradient plot 150 and the voltage-and-current versus temperature-gradient plot 170 illustrate several suitable thermoelectric devices; but the preferred TE device (with respect to amount of power output) of those tested (devices 1, 2 and 3) is part number 6301/127/030 (device 2) due to its output characteristics. It will be understood by those skilled in the art that TE devices other than device 2 may be desired—depending on the desired output characteristics or other characteristics of TE devices.

In general terms, the present invention utilizes a temperature gradient in a downhole well and a thermoelectric device located therein to generate electric energy to power downhole electrical devices and systems and charge downhole battery packs.

FIGS. 4 and 5 illustrate that electrical power may be generated in regions of a well where a temperature gradient is present, even at a relatively low temperature gradient $\Delta T$ of about fifty (50) degrees-Celsius. Temperature gradients are either inherently present in a well system or are generated (or induced) by utilization of a mechanical device or by a given construction of the well system.

For example, inherent temperature gradients $\Delta T$ occur due to a differential in the temperature of the oil or gas flowing upward through the tubing string 34 and the well bore or casing 16 or well annulus 40. Temperature gradients may be present near the formation 18 or anywhere along the length of the well.

Induced temperature gradients are generally generated by adding mechanical devices in the well system (e.g., frictional heat generation devices) or designing the well system in a given fashion. These types of temperature gradients usually have a higher temperature differential than the inherent temperature gradients in the well system. As will be appreciated, the addition of induced (and higher) temperature gradients may result in an increase in the power output of the TE device 100.

As described above, the application of a temperature gradient $\Delta T$ across the TE device 100 generates an electrical potential $V_O$ at the electrical terminals 118 and 119. When oil or gas (or other material) from the formation 18 flows through the tubing string 34, a heat source $T_H$ is available along the length of the tubing string 34.

The heat source $T_H$ and a heat sink source $T_C$ located proximate the heat source $T_H$ is used to generate a temperature gradient or differential $\Delta T$ that is applied to the TE device 100 resulting in the generation of electrical power.

Additionally, a plurality of TE devices 100 may be arranged for a cumulative output. Arranging multiple TE devices 100 in a parallel circuit provides a greater electrical current I output while arranging multiple TE devices 100 in a series circuit provides a greater electric potential $V_O$ output. For example, with reference to FIG. 5, if the available temperature gradient $\Delta T$ is sixty degrees-Celsius at a given well location, the voltage potential $V_O$ for the TE device 100 is about 1.8 volts. Should an output voltage of four (4) volts be desired, three TE devices 100 may be connected in parallel to provide a cumulative voltage of about 5.4 volts. Additional electrical circuitry—such as a conventional voltage dividers—can be used to reduce this level to the required 4 volts. Such configurations, in conjunction with other circuitry, may be used to provide the output power needed to supply the demands of downhole electronic devices and systems, including battery packs.

Other ways and means known to those skilled in the art may be used to convert the output voltage and/or current from the TE devices 100 into any desired output voltage and/or current for use as described above, including use of step-up and/or step-down converters. Use of converters is described below.

FIGS. 6 through 9 illustrate different embodiments or configurations of the present invention.

Figure 6:
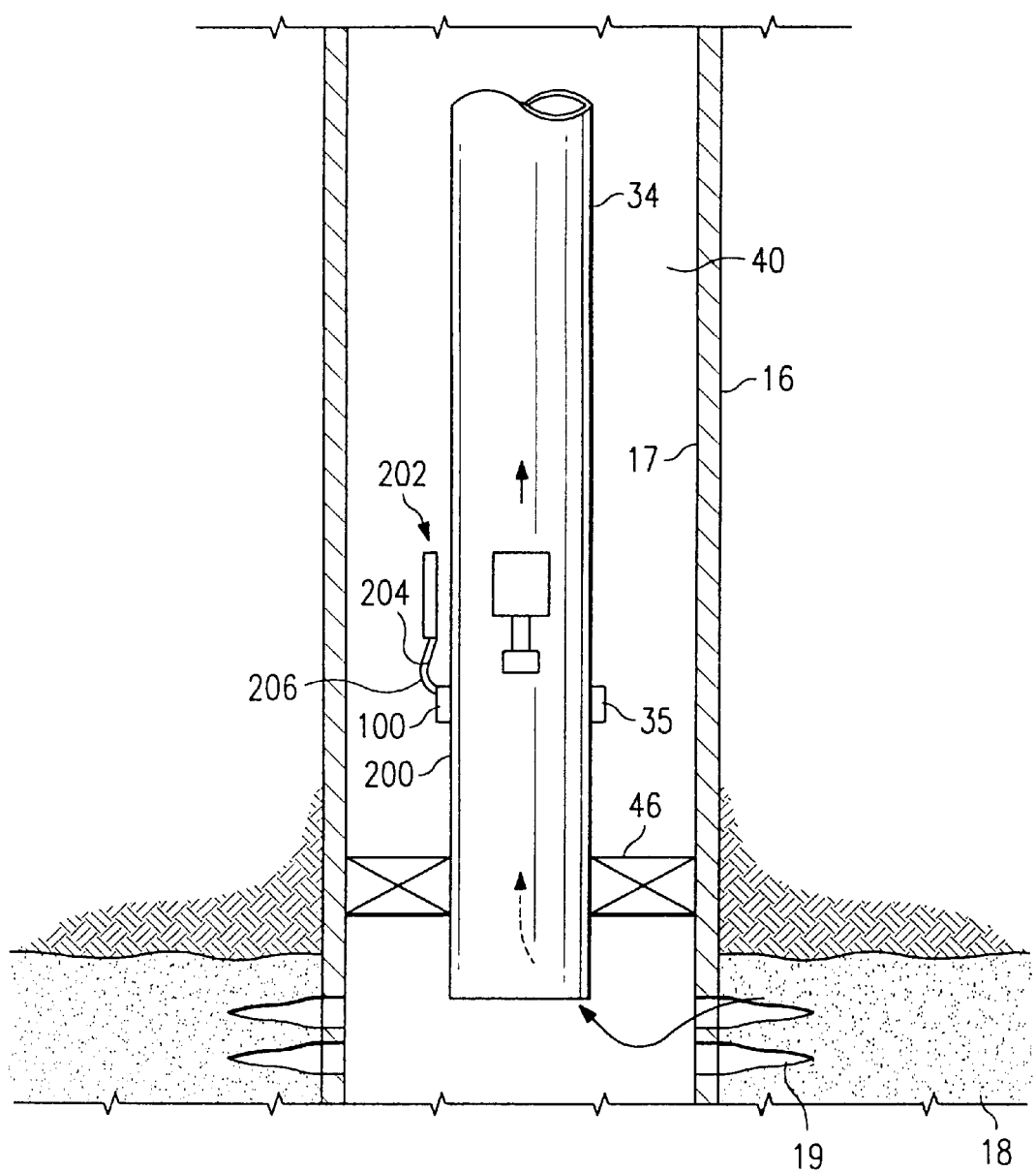
FIG. 6 is a plan view of a thermoelectric device with a temperature gradient applied in a well.

Now referring to FIG. 6, there is illustrated one embodiment of the present invention. The thermocouple 108 of the TE device 100 (see FIGS. 2 and 3) is thermally coupled to the outer surface 33 of the tubing string 34 via a heat source coupler 120a and mating coupler 120b (as described earlier with respect to FIG. 3) or other thermal-coupling arrangement. The coupler is not shown in FIG. 6 to eliminate clutter and promote understanding of the invention.

The thermocouple 106 of the TE device 100 is thermally coupled to fluids in the well annulus 40 (or area around the well annulus 40) via the heat sink coupler 116 (as described earlier with respect to FIG. 3). It will be understood that a heat source coupler 120a and 120b and a heat sink coupler 116 may or may not be used, but are preferably used to increase thermal coupling.

The temperature $T_F$ of the produced fluid flowing through the inner bore 35 of the tubing string 34 and the temperature $T_A$ of the well annulus 40 provide a temperature gradient or differential $\Delta T$ that is applied across the TE device 100. The produced fluid provides the heat source $T_H$ and the well annulus 40 provides the heat sink source $T_C$. The produced fluid flow temperature $T_F$ at the subterranean formation 18 is typically about 135-degrees Celsius. As will be appreciated, the term "fluid" as used herein means a material capable of flowing, and may include gases, liquids, plastics, and solids that can be handled in the manner of a liquid.

The temperature gradient or differential $\Delta T$ applied across the TE device 100 causes the device 100 to generate a voltage potential Vo across the terminals 118 and 119, thereby providing a source of electric power. Terminals 118 and 119 are connected to electrical conductors 204 and 206, which in turn are coupled to a battery pack 202. The power generated by the TE device 100 is used to recharge the battery pack 202. Generally, the battery pack 202 is used to provide power to one or more electrically-powered downhole devices or systems (represented by a block diagram having reference numeral 220). Alternatively the output of the TE device 100 may be coupled directly to the one or more electrically-powered downhole devices or systems 220 as an electric voltage or current source (i.e. electric power).

The battery pack 202 includes electric energy storage cells that provide a power supply for electrically-powered downhole devices or systems. The cells of the battery pack 202 are rechargeable. Battery packs and/or storage cells are commercially available from Duracell USA, Eveready Battery Company or Toshiba Battery Company Ltd.

As can be appreciated, a TE module 100 can be placed further downhole than conventional downhole electric or hydraulic power configurations which require cables to travel down with the tubing string 24.

Accordingly, with the present invention, a safety valve or a well monitoring device can be placed closer to the subterranean formation 18 than conventional devices. This configuration is highly desirable as the formation is more manageable at this level in that quicker detection and well control can minimize pressure transients that can travel to the surface of the submerged well 12, which can lead to damage of the wellhead components.

Figure 7:
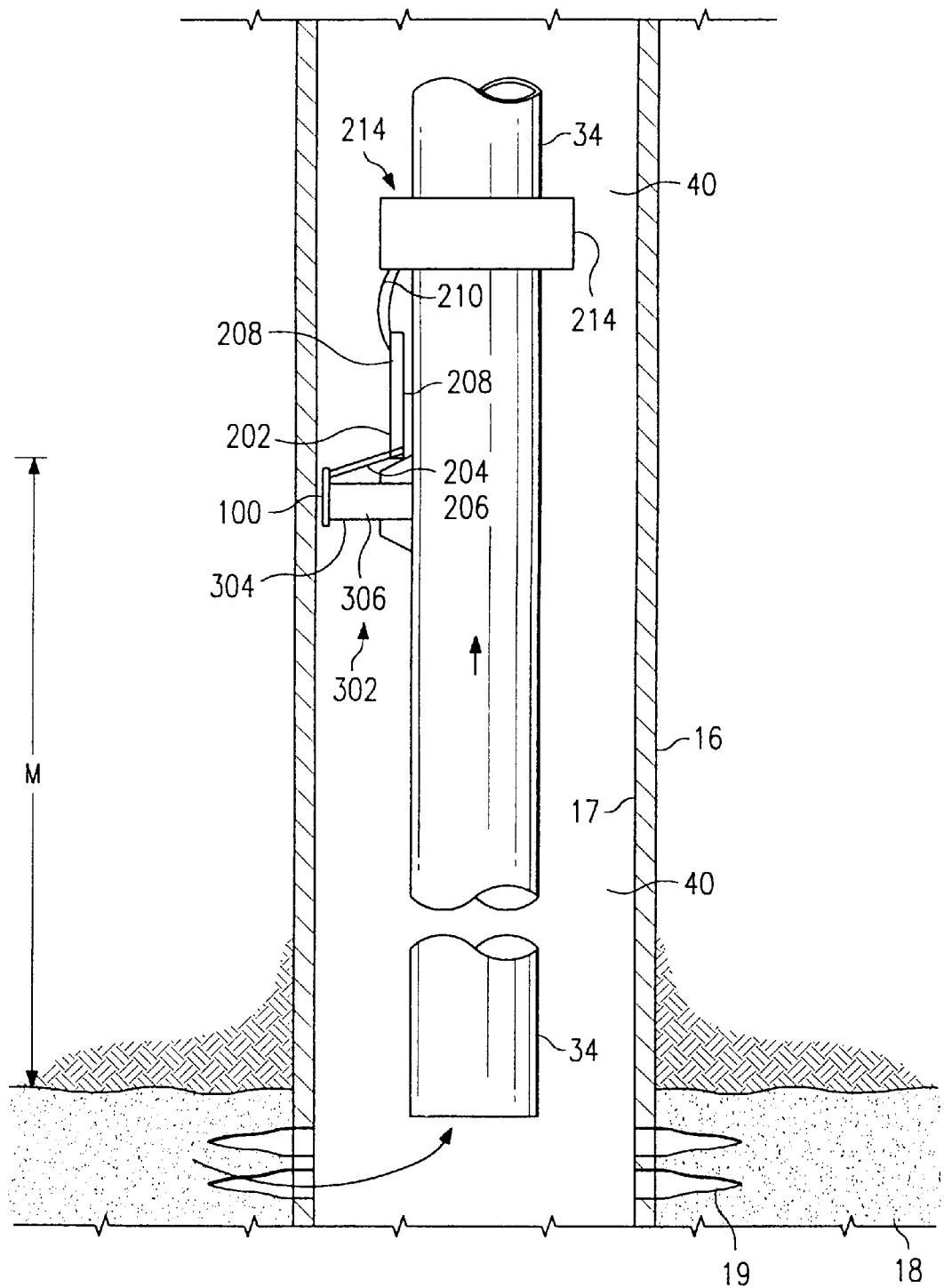
FIG. 7 is a plan view of a geothermal apparatus with an extendable probe for thermally-coupling a thermoelectric device with an inner surface of a well.

Now referring to FIG. 7, there is illustrated an alternative embodiment of the present invention. The surface 110 of the thermocouple 108 of the TE device 100 is thermally coupled to the inner surface 17 of the casing string 16 via a heat source coupler or conductor 300. The heat source coupler 300 functions similarly to the heat source coupler 120 described in FIG. 3.

The temperature $T_F$ of the produced fluid flowing through the inner bore 35 of the tubing string 34 and the temperature $T_G$ (the geothermal temperature of the earth surrounding the casing string) of the casing string 16 provide a temperature gradient or differential $\Delta T$ that is applied across the TE device 100. The produced fluid provides the heat source $T_H$ (through the tubing string 34) and the casing string 16 provides the heat sink source $T_C$. As described earlier, the temperature gradient or differential $\Delta T$ applied across the TE device 100 causes the device 100 to generate a voltage potential Vo across the terminals 118 and 119, thereby providing a source of electric power.

The thermal coupler 300 extends from the TE device 100 to the tubing string 34 and provides a more effective thermal conduction path between the heat source $T_H$ and the TE device 100. In this embodiment, the heat sink source $T_C$ is provided by the casing string 16 as opposed to the well annulus 40 described in FIG. 6. It is believed that the temperature gradient or differential $\Delta T$ generated by the embodiment shown in FIG. 7 is greater than temperature gradient or differential $\Delta T$ generated by the embodiment shown FIG. 6.

The surface 110 of thermocouple 108 of the TE device 100 is coupled to the tubing string 34 through the thermal coupler 300. The thermal coupler includes a tube 304 having either a circular, quadrilateral, or other suitable cross-section. The tube 304 defines an inner void 306. Contained within the inner void 306 is a thermally-conductive material 308. Any type of material may be used that is substantially thermally conductive, such as water, glycerin, or machine oil. Preferably, solid graphite is used, which has a conduction factor of 85 BTU/degrees-Fahrenheit.

The TE device 100 is secured to a first end 310 of the tube 304. The thermocouple 106 of the TE device 100 is thermally coupled to the thermally-conductive material 308 through a thermally-conductive plate 309 with a bottom surface depression, similar to the surface depression 122 of the coupler 120a shown in FIG. 3, to receive the TE device 100. This results in the temperature of the heat source $T_H$ being substantially similar to the temperature of the tubing string ($T_{TS}$). Alternatively, the thermal coupler 300 may be constructed of substantially solid material.

The thermal coupler 300 is extendable from a first position contained within the tubing string 34 through a centralizer 314 to the deployed position illustrated in FIG. 7. An example of a device for selectively extending the thermal coupler 300 or other device in formation testing tools having selectively extendable test probes, is a device such as that described in U.S. Pat. No. 5,065,619, issued to Myska on Nov. 19, 1991, which is incorporated by reference herein for all purposes.

In another embodiment 316 similar to that shown in FIG. 7, the TE device 100 may be located proximate the tubing string, 34 while the thermal coupler 300 extends from the TE device 100 to the inner surface 17 of the casing string 16.

The present invention provides a means and method for generating electric power from a temperature gradient or differential $\Delta T$ present downhole in a well. The following provides an example illustrating how the electric power generated by the present invention may be used. The battery pack 202 may be coupled to a signal receiver and control circuit (not shown). The signal receiver and control circuit receives telemetry signals from a surface control system (not shown) located at the floating work station 10 (see FIG. 1). An example of a signal receiver and control circuit 316 is provided in U.S. Pat. No. 5,555,945, issued on Sep. 17, 1996, to Schultz et al., which is incorporated herein by reference for all purposes.

The signal receiver and control circuit is coupled to the remotely-actuated flow control valve 82 via electrical conductors 210. The flow control valve 82 (powered by the battery pack) responds to actuation signals from the signal receiver and control circuit such that the flow control valve 82 is selectively placed in a "closed" or "open" position preventing or allowing, respectively, flow through the tubing string 34. Accordingly, electric power generated by the present invention is stored in the battery pack 202 and thereafter used to power the control valve and the signal receiver and control circuit.

In some wells, utilization of the present invention as embodied and described in FIGS. 6 and 7 may produce a relatively low amount of power because the temperature gradients or differentials $\Delta T$s may be relatively low. As illustrated in FIGS. 4 and 5, when the temperature gradient or differential $\Delta T$ applied across the TE device 100 increases, the amount of electric power generated by the TE device 100 also increases. The present invention further provides a means and method for increasing temperature gradients or differentials $\Delta T$s downhole in a well, thereby increasing the electric power output of the TE device 100.

Figure 8:
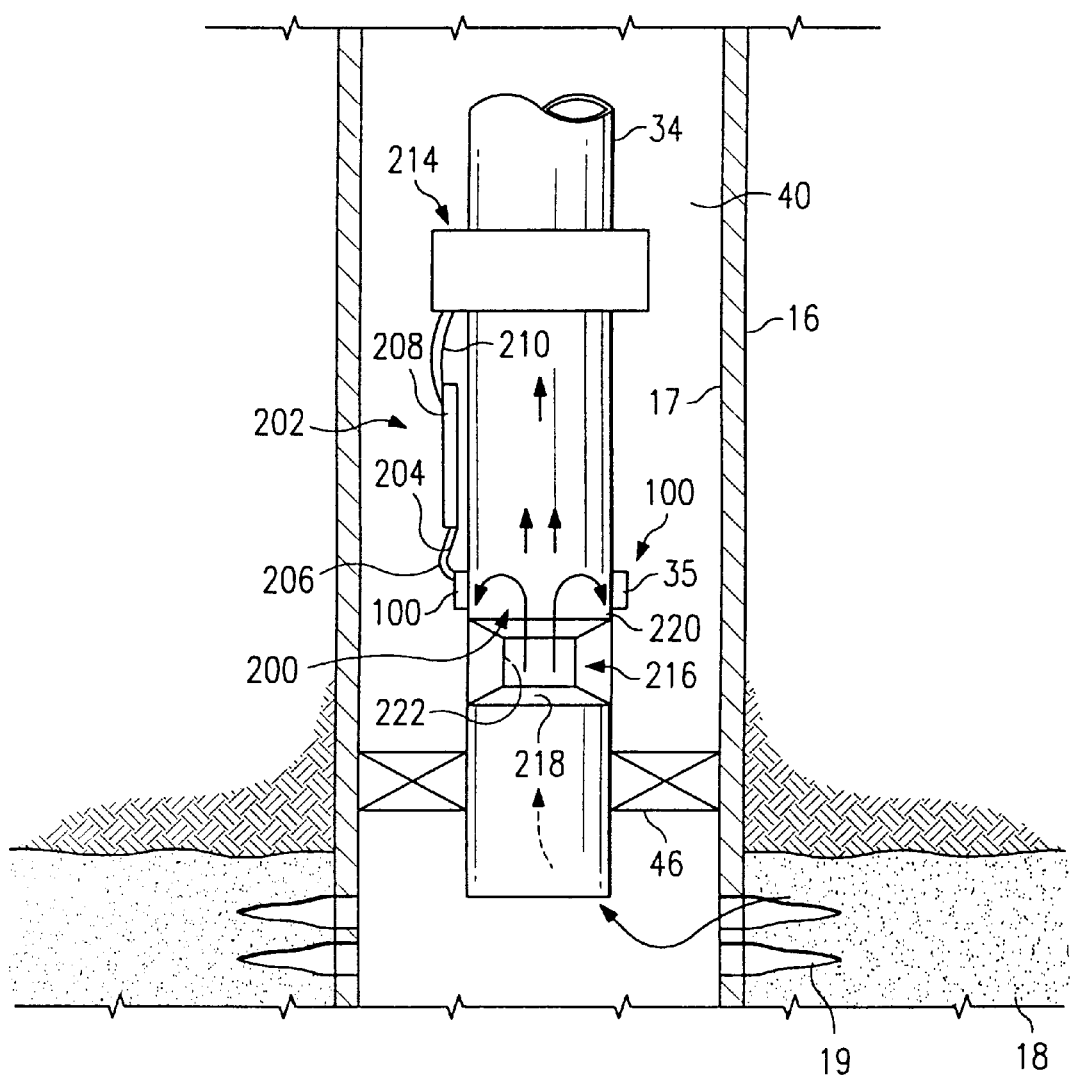
FIG. 8 is a partial-cross sectional view of a fluid-flow energy conversion device deployed in a tubing string near a producing formation.

Now referring to FIG. 8, there is illustrated the present invention shown in FIG. 6 with the addition of a device 400 that converts fluid flow energy into heat energy. The device 400 is placed or inserted in the inner bore 35 of the tubing string 34 where the fluid flow restricted therethrough to cause a change in the bulk temperature of the fluid. Depending on the gas-oil ratio ("GOR"), there will either be a decrease in temperature (if GOR>2000), or an increase in temperature due to turbulence. In one case the fluid in the annulus will be a heat source $T_H$ and in the other case a heat sink source $T_C$.

The generated heat energy increases the temperature $T_F$ of the fluid flowing therethrough, increases the temperature of the device 400 and/or increases the temperature of the tubing string 34 in the vicinity of the device 400. This results in a corresponding increase in the temperature gradient or differential $\Delta T$ between the heat source $T_H$ and the heat sink source $T_C$.

The device 400 is constructed to include an orifice 402 (for fluid flow therethrough) whereby the physical dimensions and design of the device 400 provide an obstruction or mechanism in the fluid flow that causes the temperature of the surrounding area to increase. The device 400 functions to increase the heat sink source $T_C$ (the tubing string 34, the fluid, and/or the device 400) by inducing a gas expansion and an associated cooling on a flow turbulence within the tubing string 34. In turn, the flow turbulence generates frictional heat against the inner bore 35 of the tubing string 34, thus increasing the temperature gradient $\Delta T$. The turbulence may also increase the temperature of the fluid flowing therethrough, and may increase the temperature of the device 400 itself.

The device 400 of the present invention includes the orifice 402 that has a cross-sectional blockage of about twenty-percent of the tubing string 34. The orifice 402 has a nozzle portion 404, and a diffuser portion 406 interconnected by a passage portion 408. As the fluid flow passes from the nozzle portion 404, the velocity of the fluid is increased while the pressure is decreased. The passage portion 408 sustains the velocity of the fluid flow until it reaches the diffuser portion 406, causing an increase of pressure and a decrease in fluid velocity resulting in an increase in temperature.

If the production fluid flow is primarily fluid, then the diffuser 406 generates a substantial amount of turbulence resulting in corriolis effects and eddy currents. This turbulence generates frictional heat energy against the inner surface 35 of the tubing string 34. Accordingly, the TE device 100 is placed adjacent the diffuser portion 406 to achieve a greater temperature gradient $\Delta T$.

If the fluid flow has a large gaseous constituent, then the nozzle portion 404 causes the gas portion of the flow to expand, resulting in substantial cooling against the inner surface 35 of the tubing string 34. Accordingly, the TE device 100 is placed adjacent the nozzle portion 404 to achieve a greater temperature gradient or differential $\Delta T$.

It will be understood by those skilled in the art that other devices, structures and methods may be used to convert the fluid flow into heat energy. Turbulence may be generated with other devices and structures, such as placing baffles along a portion of the inner bore 35. Preferably, the device 400 having an orifice 402 is used.

Figure 9:
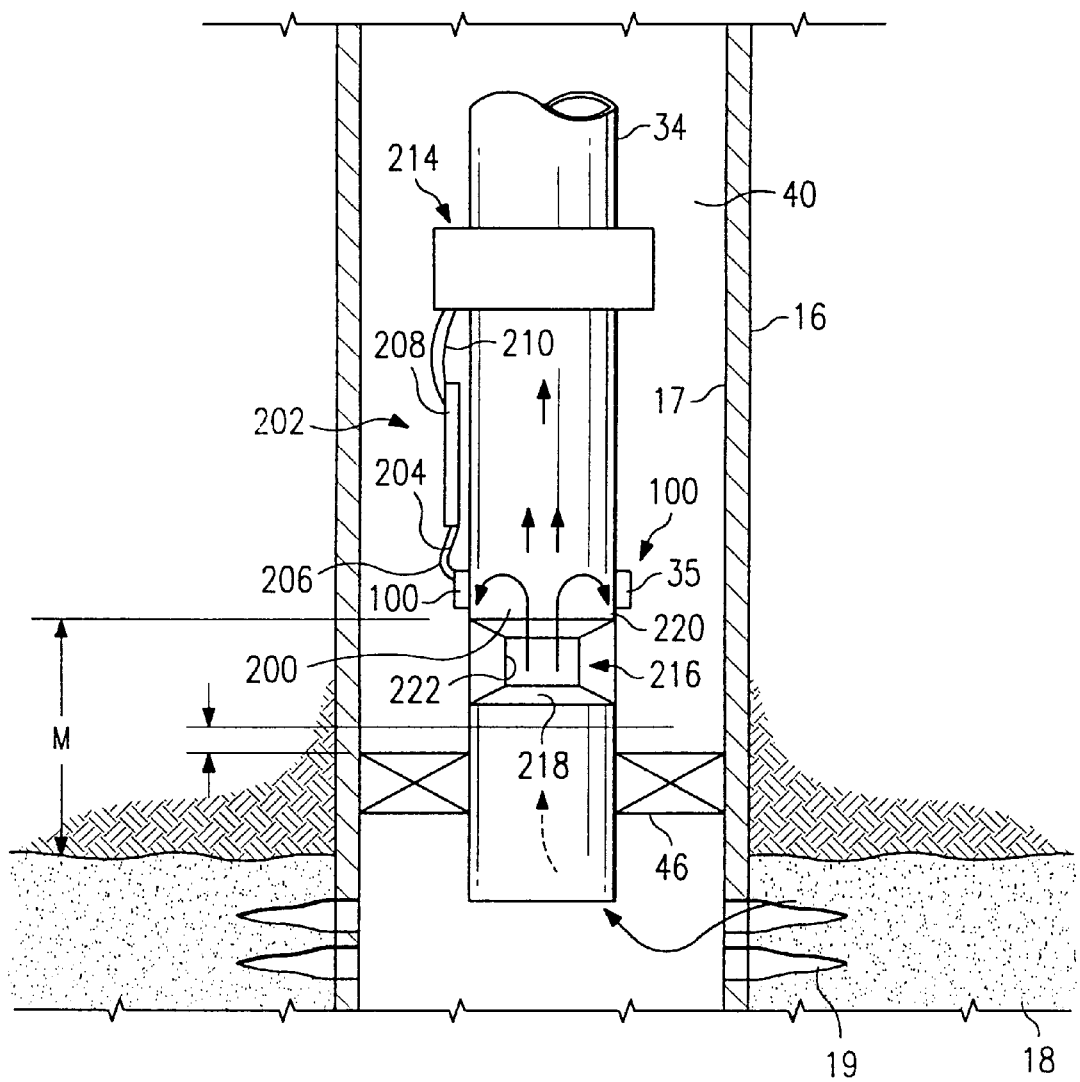
FIG. 9 is a partial cross-sectional view of a fluid-flow energy conversion device deployed in a tubing string spaced a distance from a producing formation.

Now referring to FIG. 9, there is illustrated the present invention shown in FIG. 7 with the addition of the device 400 that converts fluid flow into heat energy (as shown in FIG. 8 and described above).

Utilization of the device 400 having the orifice 402 may not be necessary when a satisfactory temperature gradient or differential $\Delta T$ is naturally occurring. For example, in the North Sea oil field region, at about 2,000 feet below the submerged well 12, the fluid flow temperature $T_F$ typically cools from about 135-degrees Celsius to about 115-degrees Celsius. The temperature $T_G$ of the surrounding earth at this depth is typically about 10-degrees Celsius.

The temperature $T_A$ of the well annulus 40 near the casing 16 is heated by the produced fluids over time to some temperature greater than the temperature of the surrounding earth $T_G$. The earth temperature is a naturally occurring geothermal temperature, but is lower than the temperature outside the tubing string 34. This temperature gradient varies from well to well and along the entire length of the tubing string 34. The closer to the surface of the well, the greater the thermal gradient potential becomes. It is possible to achieve a difference of 50-degrees Celsius which will result in a TE module output on the order of 1.3 volts and 0.5 milli-amps. Furthermore, greater efficiency and greater electric potential can be achieved by placing the TE device 100 adjacent to the inner surface 17 of the casing 16.

When the TE device 100 is deployed closer to the well surface 15, a relatively larger temperature gradient or differential $\Delta T$ between the surrounding earth (and/or casing string 16) and the tubing string 14 is present. Thus the TE device 100 has a correspondingly larger power output across the terminals 118 and 119. However, locating the TE device 100 closer to the well surface 15 (see FIG. 1) increases the distance M of the TE device 100 from the formation 18 and any corresponding downhole battery packs and electrically-powered devices and systems (thus requiring increased lengths of electrical conductors). The location at which the TE device 100 is placed depends on the temperature gradients or differentials $\Delta T$ along the length of the well and the distance M from the location to the downhole battery packs and electrically-powered devices and systems. However, with respect to electronic devices using a 5-volt bias voltage, the location should be such that the temperature gradient or differential $\Delta T$ of the location selected is at least 5-degrees Celsius since no appreciable electric power for such devices is generated when the temperature gradient or differential $\Delta T$ is less than about 5-degrees Celsius.

Figure 10:
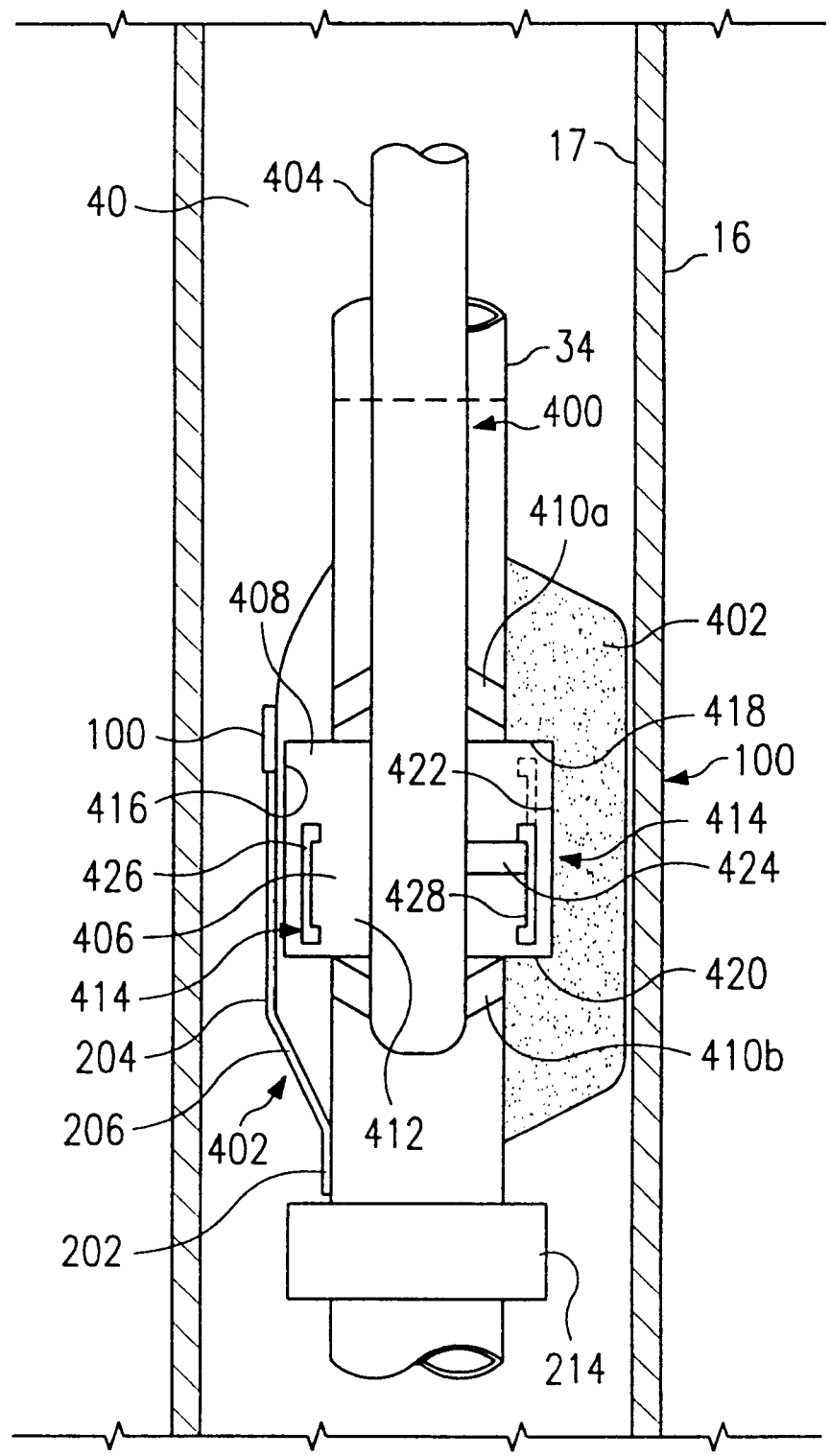
FIG. 10 is a plan view of a geothermal apparatus with an expandable element for placing a thermoelectric device in thermal contact with the inner surface of a well shown in an unexpanded configuration.
Figure 11:
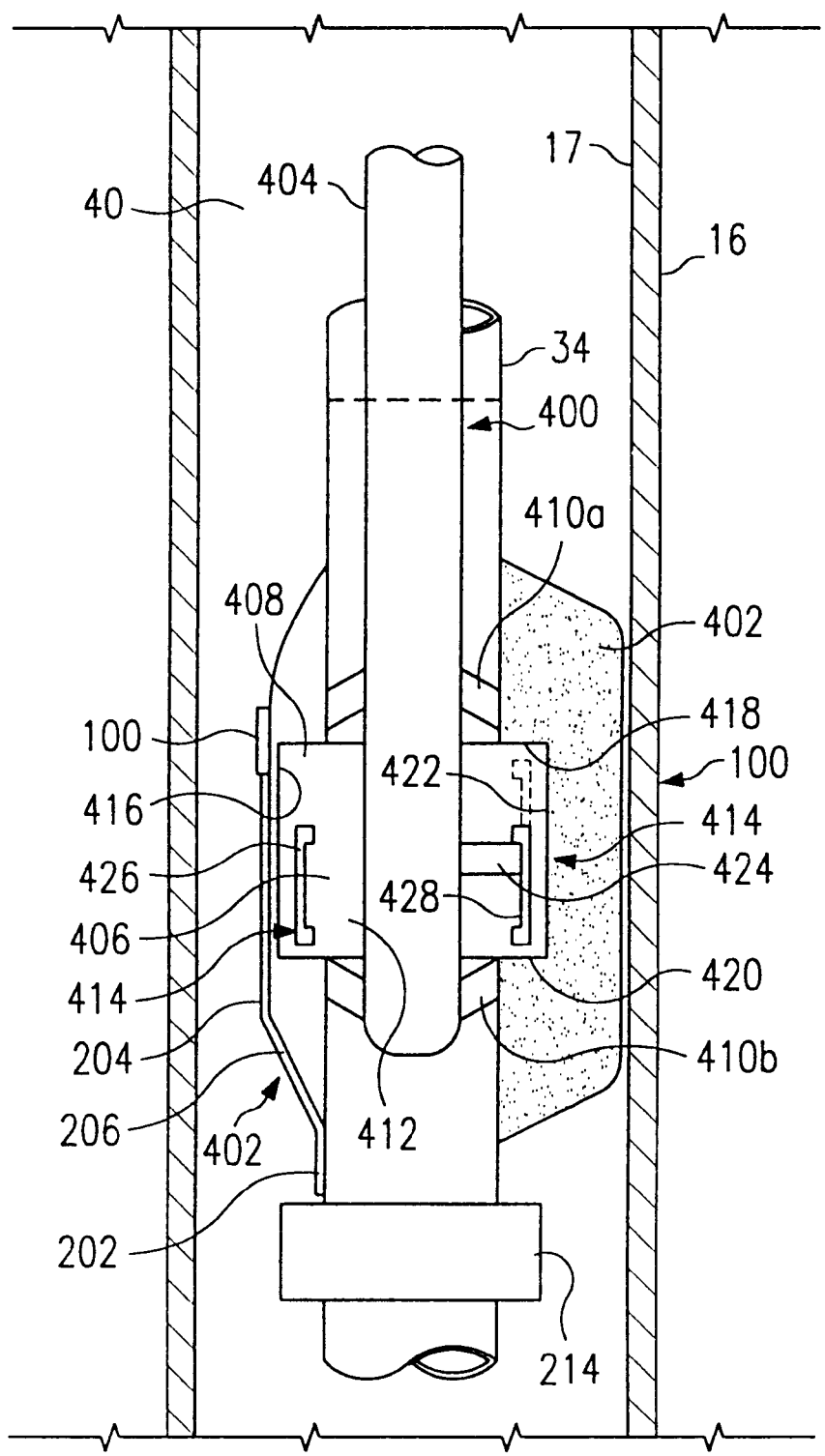
FIG. 11 is a plan view of a geothermal apparatus with an expandable element for placing a thermoelectric device in thermal contact with the inner surface of a well shown in a deployed position.

Now referring to FIGS. 10 and 11, there is illustrated another embodiment of the present invention. An selectively-deployable geothermal apparatus 500 is provided with an expandable element 502. The geothermal apparatus 500 is placed a distance M from the formation 18. The distance M from the formation 18 (see FIG. 1) is selected so that the produced fluid flow temperature $T_F$ in the tubing string 34 is greater than the geothermal temperature $T_G$ surrounding the casing 16.

FIG. 10 shows the geothermal apparatus 500 in an unexpanded configuration with the TE device 100 secured to the outside surface 501 of the expandable element 502. FIG. 11 illustrates the expandable element 502 in a deployed position for thermally coupling the thermocouple 106 of the TE device 100 with the inner surface 17 of the casing 16.

The expandable element 502 is mounted on a housing 503. The geothermal apparatus 500 is threadingly coupled to the tubing string 34 through the housing 503. A setting tool 504 extends through tubing string 34 and through a sealed chamber 506. The sealed chamber 506 defines a cavity 508 between sealing elements 510a and 510b. The cavity 508 contains a thermally-conductive fluid 512. Any type of fluid material may be used that is substantially thermally conductive, such as glycerine, pure water, machine oil, or mercury. Preferably, graphite (in a liquid or particle form) is used.

The thermally-conductive fluid 512 is retained under pressure within the cavity 508. The pressure within the cavity is greater than the pressure in the expandable element such that the fluid 512 scan be selectively released into the expandable element 502.

An opening sleeve 514 is slidingly contained within a recess 516. Recess 516 is defined in the housing 503 between a first shoulder 518 and a second shoulder 520. The opening sleeve 514 is biased to sealingly obstruct ports 522 that are defined through housing 503.

Extending from setting tool 504 is a lug 524. The lug 524 engages a J-slot pattern 526 defined in an interior surface 528 of the opening sleeve 514. The opening sleeve 514 is selectively urged towards first shoulder 520 by the setting tool 504. placing the interior of the expandable element 502 in fluid communication with the cavity 508 through ports 522.

Referring to FIG. 11, upon exposure of the port 522, the pressurized, thermally-conductive fluid 512 is released into the expandable element 502. Accordingly, the exterior surface 501 of the expandable element 502, and the TE device 100 secured thereto, is placed into thermally coupling relationship with the interior surface 17 of the casing 16.

The amount of pressure of the fluid 512 is such that the thermocouple 106 of tile TE device 100 is thermally coupled to the inner surface 17 of the casing 16 when the pressure within the cavity 508 is substantially normalized or in equilibrium through the port 522 with a pressure within the expandable element 502. As will be appreciated, a heat sink coupler having an outer concave surface adapted to the inner surface 17 of the casing may be used to increase the thermal coupling of the surface 114 of the thermocouple 106 to the surface 17 of the casing 16 (see above).

After setting the expandable element 502, the lug 524 is sheared, thereby disengaging the setting tool 504 from the opening sleeve 514. The setting tool 504 is removed from the housing 503 and the tubing string 34. After the lug 524 is sheared, the opening sleeve 514 is biased towards the second shoulder 520. When returned, the opening sleeve 514 is again in a sealing engagement with ports 522.

With the setting tool 504 removed, produced fluid flow is conducted by actuating the remotely-actuated flow control valve 82. When the flow commences, as discussed above, a temperature gradient or differential $\Delta T$ (fluid flow temperature $T_F$ in the tubing string 34 is greater than the geothermal temperature $T_G$) is applied across the TE device 100 producing an electric potential $V_O$.

Figure 12:
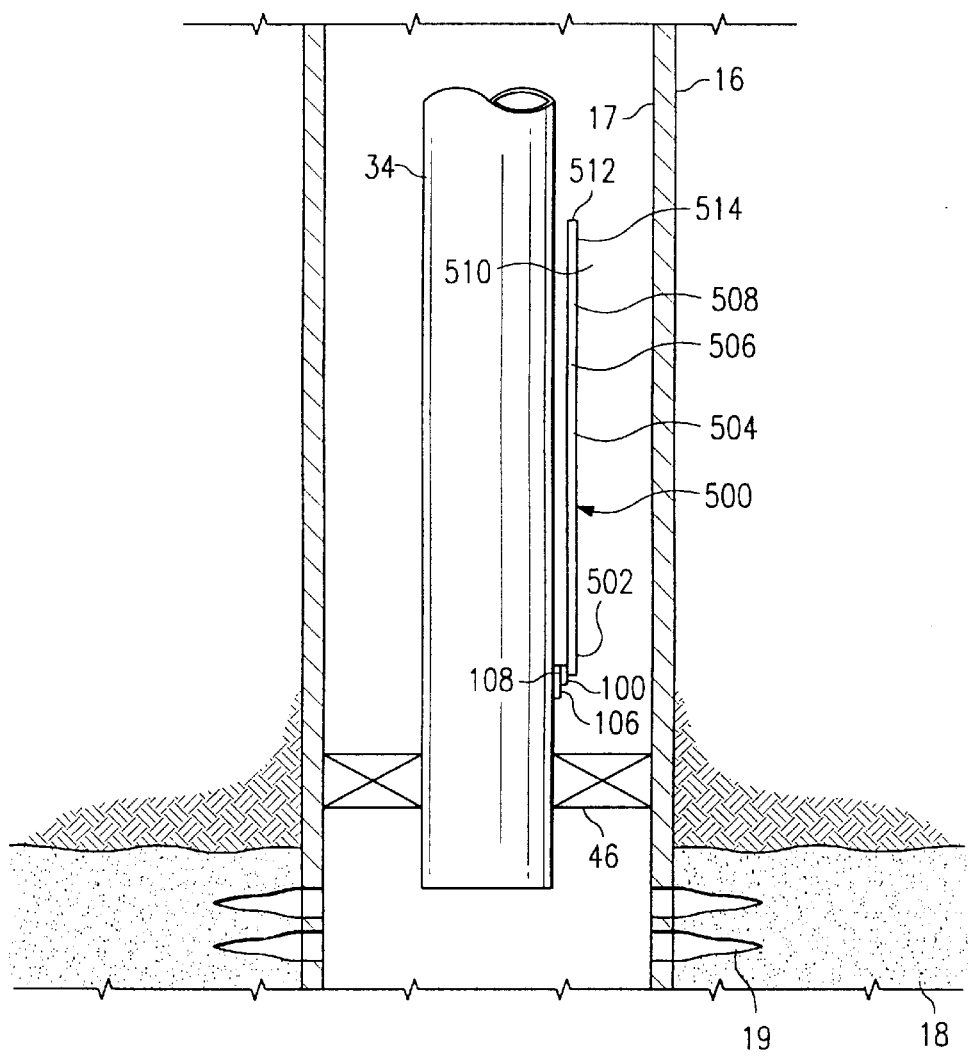
FIG. 12 is a plan view of an embodiment for generating a temperature gradient with a convective fluid device.

Now referring to FIG. 12, there is illustrated another embodiment of the present invention for generating a temperature gradient $\Delta T$ using a convective fluid device 600. The convective fluid device 600 provides a greater temperature gradient $\Delta T$ by creating a heat sink source $T_C$. This embodiment may be used in regions where the temperature $T_A$ of the well annulus is approximately equal or slightly less than the fluid flow temperature $T_F$.

The thermocouple 108 of the TE device 100 is thermally coupled to the outer surface 33 of the tubing string 34. Thermally coupled to the thermocouple 106 of the TE device 100 is a first end 502 of the device 600. The device 600 includes a chamber 506 extending, substantially the length of the device 600.

A suitable length L for the device 600 is about 2000 feet and having a chamber volume of about three (3) cubic inches. Preferably the device 600 has a length of 3000 feet and a chamber volume of ten (10) cubic inches.

A thermally-conductive fluid 608 (such as those discussed earlier) is contained in chamber 606. Preferably, the entire volume of the chamber 606 contains the fluid 608. A second end 610 of the device 600 includes a heat sink unit 612 constructed of a thermally-conductive material. The heat sink unit 612 has a plurality of fins 614 to provide greater surface are a exposure to the well annulus temperature $T_A$.

With or without a fluid flow through the inner bore 35 of the tubing string 34, the thermally-conductive fluid 608 in the device 600 generates a convection current caused by the phenomena that "heat rises and cold falls." The fluid 608 in the device 600 circulates due to a thermo-siphon effect. As the fluid 608 near the first end 602 is heated, it rises towards the second end 610. As the fluid rises, the heat is dispersed or absorbed into the well annulus 40, causing the heated fluid 608 to cool. When the fluid cools, it returns to the first end 602. As the fluid circulates, the heat sink unit 612 provides a heat sink source $T_C$ that is coupled to the thermocouple 106 resulting in a temperature gradient or differential $\Delta T$ increase that does not otherwise naturally occur.

In a another embodiment, the heat source $T_H$ can be provided by an artificial source. That is, the heat source $T_H$ can be provided by a source non-native in the well environment. For example, a conventional nuclear-powered heat source can be coupled or placed in thermal relation to the first thermocouple 106. Before the TE device 100 is lowered into the well, the nuclear-powered heat source is activated and at that time generates a substantial amount of heat. Other forms of artificial heat source can likewise be used, such as combustion heat-generators, or the like. But such artificial heat sources are not preferable due to the undesirable side effects such as the generation of toxic waste products or heat source lifespans being limited by the choice of fuel used to generate heat.

The TE device 100 of the present invention has numerous uses in a downhole environment. For example, the TE device 100 (or plurality of TE devices 100) may be used to charge battery packs while downhole thereby extending the life of the battery packs or used to provide electric energy or power to electrically-powered devices and systems located downhole.

A voltage or power converter may be required to adjust the output of the device 100 to a usable level. Examples of such converters are step-up or step-down converters or transformers, voltage divider circuits, current divider circuits, and the like.

Figure 13:
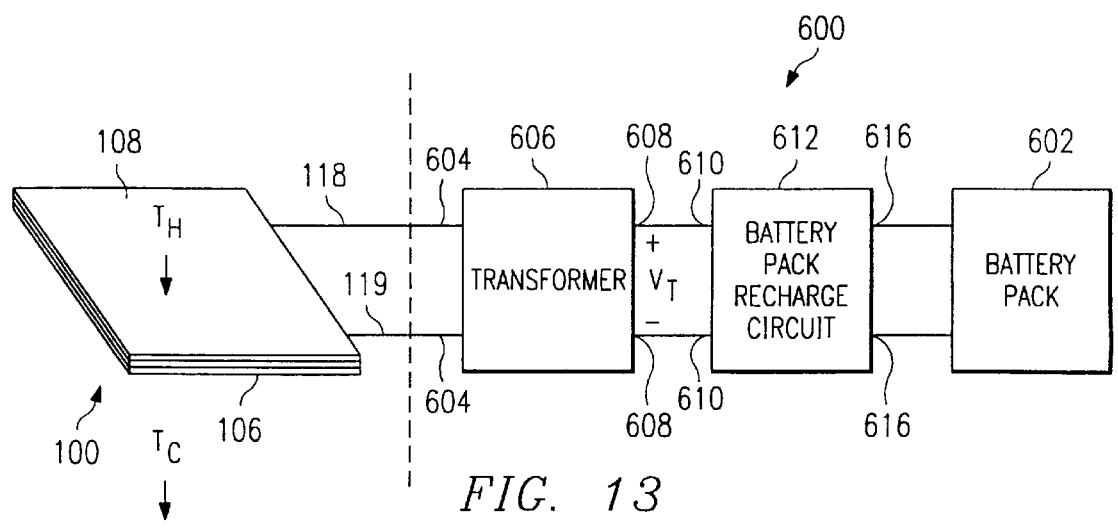
FIG. 13 is an electric schematic of a thermoelectric device in a battery-pack recharger configuration.

Now referring to FIG. 13, there is illustrated a recharger apparatus 700 of the present invention that includes the TE device 100 coupled to a battery pack 202. As will be appreciated, the TE device will be configured in one of the embodiments described above in FIGS. 6 through 12. The recharger apparatus 700 provides a recharge or maintenance voltage to the battery pack 202 use number as shown in FIGS. 6 through 12) when the TE device 100 operates as described above. Recharging extends the useful life-span ok the battery pack 202 while downhole.

The electric terminals 118 and 119 of the TE device 100 are connected to the input terminals 704 of a step-up voltage transformer 706. The output terminals 708 of the step-up voltage transformer 706 are connected to the input terminals 710 of the battery recharge circuit 712. The battery recharge circuit 712 conditions a transformer output voltage $V_T$. The output terminals 716 of the battery recharge circuit 712 are connected to the battery pack 202.

The life span of battery packs conventionally used downhole is generally determined by the design of the individual batteries the discharge rate. The present invention provides an apparatus and method of recharging downhole battery packs thus extending the life span of the battery pack. Specifications for the TE devices 100 identified above indicate that the expected life span of the TE device 100 in a two-hundred-degree Celsius environment is about twenty years. Thus, as long as fluid flows through the well the TE device 100 will provide an electric power source.

The TE device 100 can also be similarly used for providing electric power to drive packers, sliding doors, and/or safety valves. Greater electric potential or current output to drive these devices can be obtained by arranging a plurality of TE devices 100 in a power matrix (e.g. parallel, series, etc.). For example, arranging the TE devices 100 in parallel provides a greater current output, while arranging the devices in series provides a greater electric potential. With an increased output a plurality of TE devices 100 may drive such devices. Such matrix configurations in conjunction with other power circuitry, may be used to provide the necessary wattage for downhole devices. Even smaller temperature gradients are believed to be of use although a lower power output is realized because semiconductor chip technology is advancing to lower power usage thresholds. For example, 3-volt chips, and 2-volt chips arc be coming available, where 5-volt chips are the present industry standard.

Although the invention has been described with reference to a specific embodiment, these descriptions are not meant to be construed in a limiting sense. Various modifications of the disclosed embodiments, as well as alternative embodiments of the invention will become apparent to persons skilled in the art upon reference to the description of the invention. It is therefore contemplated that the claims will cover any such modifications or embodiments that fall within the true scope and spirit of the invention.

What is claimed is:

1. A method for providing electric power in a well, the method comprising the step of:
   applying a temperature gradient of the well across a first thermocouple and a second thermocouple of at least one thermoelectric device having an electric power output terminal.

2. The method of providing electric power of claim 1 further comprising the step of:
   providing a geothermal apparatus to apply the temperature gradient across the thermoelectric device.

3. The method of providing electric power of claim 2 further comprising the step of extending an extendable thermal coupler that has a first end thermally coupled with the first thermocouple of the thermoelectric device, such that the thermal coupler selectively thermally couples the second thermocouple of the thermoelectric device with a well bore surface of the well.

4. The method of providing electric power of claim 2 further comprises the step of expanding an expandable element with a conducting fluid, thermally coupled with the first thermocouple of the thermoelectric device, such that the expandable element selectively thermally couples the second thermocouple of the thermoelectric device with a well bore surface of the well.

5. The method of providing electric power of claim 1 further comprising the step of inducing the temperature gradient by converting a fluid flow energy into a heat energy.

6. The method of providing electric power of claim 1 further comprising the step of:
   expanding an expandable convection fluid apparatus such that the expandable convection fluid apparatus thermally couples with the second thermocouple of the thermoelectric device.

7. The method of providing electric power of claim 1 further comprising the step of:
   thermally coupling a nuclear-powered heat source with the first thermocouple.

8. The method as recited in claim 1, further comprising the step of creating a temperature gradient for the well by circulating a thermally-conductive fluid.

9. An apparatus for providing electric power while in a well, the apparatus comprising:
   a tubing string for conveying a fluid flow heat source from a subterranean formation; and
   a thermoelectric device having a first thermocouple, a second thermocouple, and an electric power terminal, said first thermocouple is thermally coupled with said tubing string, and said second thermocouple is thermally coupled with a heat sink source of the well.

10. The apparatus for providing electric power of claim 9 further comprising:
    a flow energy conversion device within said tubing string for further increasing a temperature of said fluid flow heat source adjacent to said thermoelectric device.

11. The apparatus for providing electric power of claim 9 further comprising:
    an apparatus for minimizing thermal resistance between said second thermocouple and said heat sink source of the well.

12. The apparatus for providing electric power of claim 11 wherein said apparatus for minimizing thermal resistance comprises:
    a geothermal apparatus selectively thermally coupling said second thermocouple with an inner surface of the well.

13. The apparatus for providing electric power of claim 12 wherein said geothermal apparatus comprises:
    a thermal coupler selectively extendable from said tubing string, said heat pipe thermally coupling said first thermocouple of said thermoelectric device with said fluid flow heat source and thermally coupling said second thermocouple of said thermoelectric device with said heat sink source of the well when in an extended position.

14. The apparatus for providing electric power of claim 13 wherein said heat sink source comprises a well bore surface of the well.

15. The apparatus for providing electric power of claim 11 wherein said apparatus for minimizing thermal resistance comprises:
    an expandable element mounted to said tubing string, said expandable element thermally coupling said first thermocouple of said thermoelectric device with said fluid flow heat source and thermally coupling said second thermocouple of said thermoelectric device with said heat sink source of the well when in a deployed position.

16. The apparatus for providing electric power of claim 15 wherein said heat sink source comprises a well bore surface of the well.

17. The apparatus of claim 9 further comprising a circulating device coupled to said thermoelectric device, said circulating device containing thermally conductive fluid, wherein the circulating device circulates the thermally conductive fluid using a thermo-siphon effect to create a thermal differential in the well.

18. An apparatus for extending a life span of a downhole battery pack, the apparatus comprising:
    a thermoelectric device having a first thermocouple, a second thermocouple, and an electric power terminal, said first thermocouple is thermally coupled with a well heat source, and said second thermocouple is thermally coupled with a well heat sink source; and
    a battery recharge circuit having an input terminal and an output terminal, said input terminal coupled to said electric power terminal of said thermoelectric device, and said output terminal for electrically coupling said battery recharge circuit to a downhole electronic device.

19. The apparatus for extending a life span of a downhole battery pack of claim 18, wherein said battery recharge circuit comprises a step-up transformer.

20. A method of generating electric power downhole in a well comprising the steps of:
    locating a thermoelectric device downhole in a well, the thermoelectric device having a first surface, a second surface, a first and a second terminal;
    coupling the first surface of the thermoelectric device to a heat source; and
    coupling the second surface of the thermoelectric device to a heat sink source, whereby a temperature differential between the temperature of the heat source and the temperature of the heat sink source causes the thermoelectric device to generate a voltage potential between the first and the second terminal of the thermoelectric device.

21. The method of generating electric power downhole of claim 20 wherein the heat source comprises a produced fluid from a subterranean formation.

22. The method of generating electric power downhole of claim 20 wherein the heat sink source comprises a well bore of the well.

23. A method for generating electric power with a thermoelectric device located downhole in a well, the method comprising the steps of:
- applying a downhole heat source to a first surface of the thermoelectric device; and
- applying a downhole heat sink source to a second surface of the thermoelectric device.

24. An apparatus for providing electric power while in a well, the apparatus comprising:
- a tubing string for conveying a fluid flow heat source from a subterranean formation;
- a thermoelectric device thermally coupled to the tubing string, the thermoelectric device having a first thermocouple, a second thermocouple; and an electric power terminal;
- an expandable element with at least one expandable void, wherein the expandable element is thermally coupled to the second thermocouple and is thermally coupled to a heat sink source of the well; and
- a thermoelectric conductive fluid filling the expandable void.

25. The apparatus of claim 24, wherein the expandable element further comprises a thermal coupler selectively extendable from said tubing string such that when in an extended position the thermal coupler thermally couples with the heat sink source of the well.

26. The apparatus of claim 24, wherein the expandable element selectively expandable from said tubing string such that when in an expanded position the membrane conforms to the interior surface of the well and thermally couples with the heat sink of the well.

27. An apparatus for providing electric power while in a well, the apparatus comprising:
- a thermoelectric device thermally coupled to a heat source, the thermoelectric device having a first thermocouple, a second thermocouple thermally coupled to a heat sink source; and an electric power terminal; and
- a means to generate a temperature gradient across the heat source and heat sink by creating a convection fluid circulation.

* * * * *